(12) United States Patent
Yoo et al.

(10) Patent No.: US 12,395,112 B2
(45) Date of Patent: Aug. 19, 2025

(54) METHODS, SYSTEMS, AND VEHICLES CONFIGURED FOR DETERMINING A STATOR RESISTANCE OF AN ELECTRIC MOTOR

(71) Applicant: GM GLOBAL TECHNOLOGY OPERATIONS LLC, Detroit, MI (US)

(72) Inventors: Anno Yoo, Rochester, MI (US); Cheng Gong, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 144 days.

(21) Appl. No.: 18/479,365

(22) Filed: Oct. 2, 2023

(65) Prior Publication Data

US 2025/0112582 A1   Apr. 3, 2025

(51) Int. Cl.
*H02P 29/64* (2016.01)
*B60L 15/20* (2006.01)
*G01R 27/16* (2006.01)

(52) U.S. Cl.
CPC .............. *H02P 29/64* (2016.02); *B60L 15/20* (2013.01); *G01R 27/16* (2013.01)

(58) Field of Classification Search
CPC .......... H02P 29/64; H02P 21/16; H02P 23/14; B60L 15/20; G01R 27/16; G01R 27/00; G01R 31/34; G01R 35/00

USPC ......................................... 318/473, 471, 445
See application file for complete search history.

(56) References Cited

U.S. PATENT DOCUMENTS

| | | | |
|---|---|---|---|
| 8,084,984 B2 * | 12/2011 | Lu ........................... | H02P 29/64 |
| | | | 318/432 |
| 9,450,533 B2 * | 9/2016 | Karwath ............... | F04D 27/007 |
| 9,647,602 B1 * | 5/2017 | Simili .................... | H02P 21/143 |
| 2017/0126166 A1 | 5/2017 | Simili et al. | |

* cited by examiner

*Primary Examiner* — David Luo
(74) *Attorney, Agent, or Firm* — Ingrassia Fisher & Lorenz, LLP | IF&L (57) ABSTRACT

Methods, systems, and vehicles are provided for determining a stator resistance value of an electric motor. The systems may include the electric motor including a stator and a rotor; a sensor system including configured to generate sensor data indicative of sensed operating conditions of the electric motor including a current magnitude, a current angle, a motor speed, a temperature of the stator, and a temperature of the rotor; and a controller operably coupled with the sensor system and the electric motor. The controller is configured to: determine an initial stator resistance value based on a stator reference temperature and either estimated data sensor data received from the sensor system; determine a stator temperature coefficient based on the sensor data and a stator nonlinear resistance ratio curve; and determine the stator resistance value based on the initial stator resistance value and the stator temperature coefficient.

18 Claims, 5 Drawing Sheets

FIG. 5

METHODS, SYSTEMS, AND VEHICLES CONFIGURED FOR DETERMINING A STATOR RESISTANCE OF AN ELECTRIC MOTOR

INTRODUCTION

The technical field generally relates to electric motor operation, and more particularly relates to systems and methods for determining stator resistance for a three-phase alternating current (AC) motor of, for example, a vehicle propulsion system.

Electric vehicles use control systems to manage performance, efficiency, and overall driving experience. The control systems utilize a combination of sensor inputs, algorithms, and mathematical models that provide a plurality of parameters regarding the operation of the vehicle. One such parameter is the stator resistance. A stator is a stationary component of an electric motor, and its resistance refers to how much the stator opposes the flow of an electric current. The control systems can use the stator resistance to regulate current flowing through the motor windings. By adjusting the current flow, the control systems can control the motor's torque output and acceleration characteristics. Accurate knowledge of the stator resistance allows the control systems to achieve consistent performance across different operating conditions.

Accordingly, it is desirable to provide systems and methods that are capable of accurately determining the stator resistance of an electric motor during operation thereof. Furthermore, other desirable features and characteristics of the present invention will become apparent from the subsequent detailed description and the appended claims, taken in conjunction with the accompanying drawings and the foregoing technical field and background.

SUMMARY

A method is provided for use with an electric motor. In one example, the method includes, with one or more processors: determining, by the one or more processors, an initial stator resistance value based on a stator reference temperature and either estimated data or sensor data indicative of sensed conditions of an electric motor including a current magnitude, a current angle, a motor speed, a temperature of a stator of the electric motor, and a temperature of a rotor of the electric motor; determining a stator temperature coefficient based on the sensor data and a stator nonlinear resistance ratio curve; and determining the stator resistance value based on the initial stator resistance value and the stator temperature coefficient.

In various examples, the stator reference temperature of the method is determined, with the one or more processors, by: receiving, designed resistance values of the stator of the electric motor; determining at least two resistance values for the stator for at least two different reference temperatures of the stator; determining temperature coefficient values for the stator for each the at least two different reference temperatures; determining calculated resistance values for the stator for each of the at least two different reference temperatures based on the at least two resistance values and the temperature coefficient values; determining error values between the designed resistance values and the calculated resistance values at each of the at least two different reference temperatures; determining which of the at least two different reference temperatures has a lowest of the error values; and setting the one of the at least two different reference temperatures with the lowest of the error values as the stator reference temperature.

In various examples, the temperature coefficient values of the method are defined by nonlinear resistance ratio curves.

In various examples, the initial stator resistance value is determined based on the sensor data and the stator reference temperature.

In various examples, the stator nonlinear resistance ratio curve of the method is based on the stator reference temperature.

In various examples, the electric motor of the method is a component of a propulsion system for a vehicle, wherein the stator resistance value is determined during operation of the propulsion system.

In various examples, the electric motor of the method is a 3-phase alternating current motor.

In various examples, the method includes adjusting an operating parameter of the electric motor based on the stator resistance value.

A system is provided for use with an electric motor. In one example, the system includes the electric motor including a stator and a rotor; a sensor system including one or more sensors configured to generate sensor data indicative of sensed operating conditions of the electric motor including a current magnitude, a current angle, a motor speed, a temperature of the stator, and a temperature of the rotor; and a controller operably coupled with the sensor system and the electric motor. The controller is configured to, by one or more processors: determine an initial stator resistance value based on a stator reference temperature and either estimated data or sensor data received from the sensor system; determine a stator temperature coefficient based on the sensor data and a stator nonlinear resistance ratio curve; and determine a stator resistance value based on the initial stator resistance value and the stator temperature coefficient.

In various examples, the stator reference temperature used by the controller of the system is a first of a plurality of reference temperatures, wherein each of the plurality of reference temperatures are used for determining corresponding calculated resistance values for the stator, wherein error values are determined between the calculated resistance values and corresponding designed resistance values of the stator at the plurality of reference temperatures, wherein the first of the plurality of reference temperatures has a lowest of the error values. In various examples, the calculated resistance values are based on a plurality of resistance values at each of the plurality of reference temperatures and temperature coefficient values at each of the plurality of reference temperatures, and the temperature coefficient values are defined by nonlinear resistance ratio curves.

In various examples, the initial stator resistance value is determined by the controller of the system based on the sensor data and the stator reference temperature.

In various examples, the stator nonlinear resistance ratio curve used by the controller of the system is based on the stator reference temperature.

In various examples, the electric motor of the system is a component of a propulsion system for a vehicle, wherein the stator resistance value is determined during operation of the propulsion system.

In various examples, the electric motor of the system is a 3-phase alternating current motor.

In various examples, the controller of the system is configured to, by the one or more processors, adjust an operating parameter of the electric motor based on the stator resistance value.

A vehicle is provided that, in one example, includes an electric motor including a stator and a rotor; a sensor system including one or more sensors configured to generate sensor data indicative of sensed operating conditions of the electric motor including a current magnitude, a current angle, a motor speed, a temperature of the stator, and a temperature of the rotor; and a controller operably coupled with the sensor system and the electric motor. The controller is configured to, by one or more processors: an initial stator resistance value based on a stator reference temperature and either estimated data or receive sensor data received from the sensor system; determine a stator temperature coefficient based on the sensor data and a stator nonlinear resistance ratio curve; determine a stator resistance value based on the initial stator resistance value and the stator temperature coefficient; and adjust an operating parameter of the electric motor based on the stator resistance value.

In various examples, the stator reference temperature used by the controller of the vehicle is a first of a plurality of reference temperatures, wherein each of the plurality of reference temperatures are used for determining corresponding calculated resistance values for the stator, wherein error values are determined between the calculated resistance values and corresponding designed resistance values of the stator at the plurality of reference temperatures, wherein the first of the plurality of reference temperatures has a lowest of the error values, wherein the initial stator resistance value is determined based on the sensor data and the stator reference temperature.

In various examples, the stator nonlinear resistance ratio curve used by the controller of the vehicle is based on the stator reference temperature.

In various examples, the electric motor of the vehicle is a component of a propulsion system of the vehicle, wherein the stator resistance value is determined during operation of the propulsion system.

BRIEF DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding technical field, background, brief summary or the following detailed description. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with any number of systems, and that the systems described herein is merely exemplary embodiments of the present disclosure.

For the sake of brevity, conventional techniques related to signal processing, data transmission, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

Systems and methods described herein promote efficient operation of an electric motor, such as a 3-phase alternating current (AC) motor. In particular, the systems and methods provide for accurately determining stator resistance during operation of the electric motor. The systems and methods account for a nonlinear relationship of stator resistance at various operating speeds of the electric motor by, in some embodiments, determining a reference temperature having a low error relative to other possible reference temperatures. The systems and methods may promote efficient determination of the stator resistance with relatively little processing power.

Figure 1:
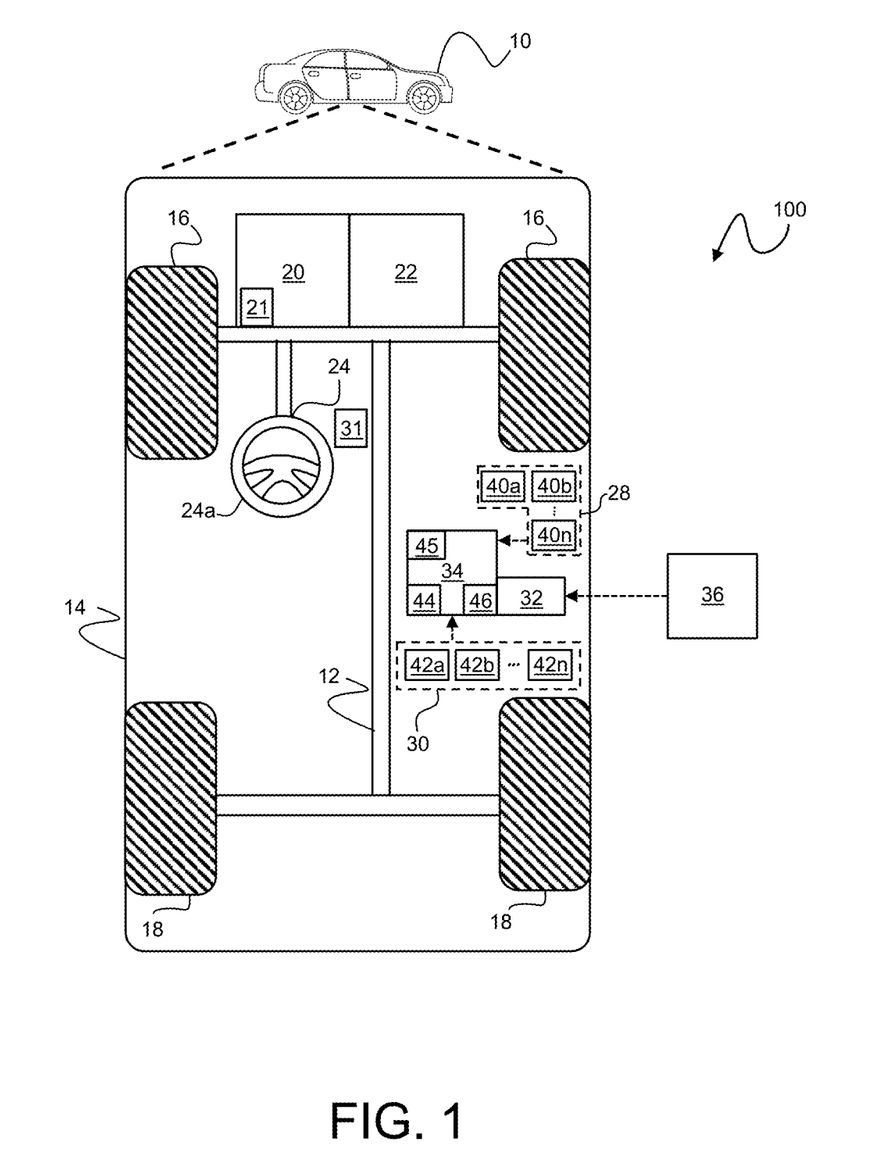
FIG. 1 is a functional block diagram of a vehicle having a motor control system configured to operate in combination with an electric motor of the vehicle. in accordance with an embodiment.

FIG. 1 illustrates a vehicle 10 according to an exemplary embodiment. In certain embodiments, the vehicle 10 comprises an automobile. The vehicle 10 includes a motor control system 100 having a database with one or more reference temperatures accessible by the motor control system 100 for calculating or referencing a stator resistance of an electric motor 21 of the vehicle 10. The reference temperature(s) are determined using methods disclosed herein.

In various embodiments, the vehicle 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD), and/or various other types of vehicles or mobile platforms in certain embodiments.

As depicted in FIG. 1, the exemplary vehicle 10 generally includes a chassis 12, a body 14, front wheels 16, and rear wheels 18. The body 14 is arranged on the chassis 12 and substantially encloses components of the vehicle 10. The body 14 and the chassis 12 may jointly form a frame. The wheels 16-18 are each rotationally coupled to the chassis 12 near a respective corner of the body 14.

The vehicle 10 further includes a propulsion system 20, a transmission system 22, a steering system 24, a sensor system 28, an actuator system 30, at least one data storage device 32, at least one controller 34, and a connection (e.g., via a wireless communication system) to a remote system 36. The propulsion system 20 includes an electric motor 21, such as a 3-phase AC motor. The transmission system 22 is configured to transmit power from the propulsion system 20 to the wheels 16-18 according to selectable speed ratios. According to various embodiments, the transmission system 22 may include a step-ratio automatic transmission, a continuously-variable transmission, or other appropriate transmission. The steering system 24 influences a position of the wheels 16-18. While depicted as including a steering wheel for illustrative purposes, in some embodiments contemplated within the scope of the present disclosure, the steering system 24 may not include a steering wheel.

The sensor system 28 includes one or more sensing devices 40a-40n that sense observable conditions of the exterior environment, the interior environment, and/or a status or condition of a corresponding component of the vehicle 10 and provide such condition and/or status to other systems of the vehicle 10, such as the controller 34. It should be understood that the vehicle 10 may include any number of the sensing devices 40a-40n. The sensing devices 40a-40n can include, but are not limited to, current sensors, voltage sensors, temperature sensors, motor speed sensors, position sensors, etc.

The actuator system 30 includes one or more actuator devices 42a-42n that control one or more vehicle features such as, but not limited to, the propulsion system 20, the transmission system 22, and/or the steering system 24.

The data storage device 32 stores data for use in controlling the vehicle 10 and/or systems and components thereof. As can be appreciated, the data storage device 32 may be part of the controller 34, separate from the controller 34, or part of the controller 34 and part of a separate system. The data storage device 32 can be any suitable type of storage apparatus, including various different types of direct access storage and/or other memory devices. In one exemplary embodiment, the data storage device 32 comprises a program product from which a computer readable memory device can receive a program that executes one or more embodiments of one or more processes of the present disclosure, such as the steps of the process discussed further below in connection with FIG. 3. In another exemplary embodiment, the program product may be directly stored in and/or otherwise accessed by the memory device and/or one or more other disks and/or other memory devices.

The controller 34 includes at least one processor 44, a communication bus 45, and a computer readable storage device or media 46. The processor 44 performs the computation and control functions of the controller 34. The processor 44 can be any custom made or commercially available processor, a central processing unit (CPU), a graphics processing unit (GPU), an auxiliary processor among several processors associated with the controller 34, a semiconductor-based microprocessor (in the form of a microchip or chip set), a macroprocessor, any combination thereof, or generally any device for executing instructions. The computer readable storage device or media 46 may include volatile and nonvolatile storage in read-only memory (ROM), random-access memory (RAM), and keep-alive memory (KAM), for example. KAM is a persistent or non-volatile memory that may be used to store various operating variables while the processor 44 is powered down. The computer-readable storage device or media 46 may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller 34 in controlling the vehicle 10. The bus 45 serves to transmit programs, data, status and other information or signals between the various components of the vehicle 10. The bus 45 can be any suitable physical or logical means of connecting computer systems and components. This includes, but is not limited to, direct hard-wired connections, fiber optics, infrared, and wireless bus technologies.

The instructions may include one or more separate programs, each of which comprises an ordered listing of executable instructions for implementing logical functions. The instructions, when executed by the processor 44, receive and process signals from the sensor system 28, perform logic, calculations, methods and/or algorithms, and generate data based on the logic, calculations, methods, and/or algorithms. Although only one controller 34 is shown in FIG. 1, embodiments of the vehicle 10 can include any number of controllers 34 that communicate over any suitable communication medium or a combination of communication mediums and that cooperate to process the sensor signals, perform logic, calculations, methods, and/or algorithms, and generate data.

As can be appreciated, that the controller 34 may otherwise differ from the embodiment depicted in FIG. 1. For example, the controller 34 may be coupled to or may otherwise utilize one or more remote computer systems and/or other control systems, for example as part of one or more of the above-identified vehicle devices and systems. It will be appreciated that while this exemplary embodiment is described in the context of a fully functioning computer system, those skilled in the art will recognize that the mechanisms of the present disclosure are capable of being distributed as a program product with one or more types of non-transitory computer-readable signal bearing media used to store the program and the instructions thereof and carry out the distribution thereof, such as a non-transitory computer readable medium bearing the program and containing computer instructions stored therein for causing a computer processor (such as the processor 44) to perform and execute the program. Such a program product may take a variety of forms, and the present disclosure applies equally regardless of the particular type of computer-readable signal bearing media used to carry out the distribution. Examples of signal bearing media include recordable media such as floppy disks, hard drives, memory cards and optical disks, and transmission media such as digital and analog communication links. It will be appreciated that cloud-based storage and/or other techniques may also be utilized in certain embodiments. It will similarly be appreciated that the computer system of the controller 34 may also otherwise differ from the embodiment depicted in FIG. 1, for example in that the computer system of the controller 34 may be coupled to or may otherwise utilize one or more remote computer systems and/or other control systems.

The remote system 36 may be any suitable computing system or electronic device configured to determine reference temperatures and temperature coefficients for a stator of the electric motor 21 of the vehicle 10, generate data including the reference temperatures and temperature coefficients, and transmit relevant data to the data storage device 32 and/or the controller 34.

Figure 2:
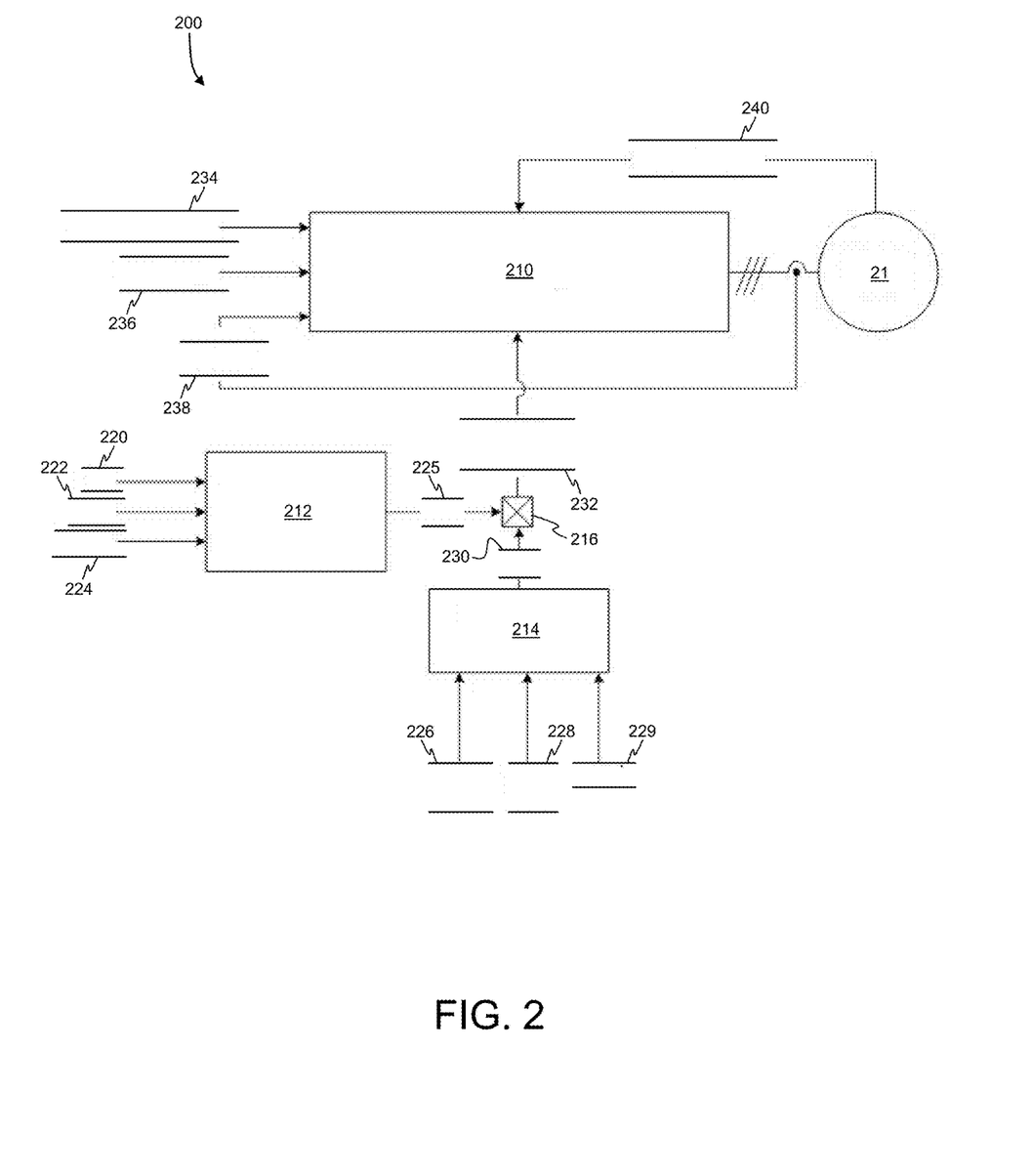
FIG. 2 is a system and dataflow diagram for the motor control system and electric motor of the vehicle of FIG. 1 in accordance with an embodiment.

With reference to FIG. 2 and with continued reference to FIG. 1, a system and dataflow diagram illustrates elements of the motor control system 100 in accordance with various embodiments. As can be appreciated, various embodiments of the motor control system 100 according to the present disclosure may include any number of modules embedded within the controller 34 which may be combined and/or further partitioned to similarly implement systems and methods described herein. Furthermore, inputs to the motor control system 100 may be received from other control modules (not shown) associated with the vehicle 10, and/or determined/modeled by other sub-modules (not shown) within the controller 34. Furthermore, the inputs might also be subjected to preprocessing, such as sub-sampling, noise-reduction, normalization, feature-extraction, missing data reduction, and the like. In various embodiments, the motor control system 100 includes a motor control module 210, an initial stator resistance module 212, a temperature coefficient module 214, and a stator resistance module 216.

In various embodiments, the initial stator resistance module 212 receives as input various sensor data generated by the sensor system 28 indicating the current magnitude 220, the current angle 222, and the motor speed 224. The initial stator resistance module 212 determines an initial stator resistance value of the stator at a preprogrammed reference temperature. In some embodiments, the initial stator resistance module 212 determines an initial stator resistance value of the stator using the sensor data. In some embodiments, the initial stator resistance module 212 determines an initial stator resistance value of the stator using calculated and/or estimated values of, for example, the current magnitude, the current angle, and/or the motor speed. The initial stator resistance module 212 generates initial stator resistance data 225 indicating the determined initial stator resistance value.

In various embodiments, the temperature coefficient module 214 receives as input sensor data generated by the sensor system 28 indicating the stator temperature 226, the rotor temperature 228, and the motor speed 224. The temperature coefficient module 214 determines a temperature coefficient value based on the sensor data and a preprogrammed nonlinear resistance ratio curve. The temperature coefficient module 214 generates temperature coefficient data 230 indicating the determined temperature coefficient value.

In various embodiments, the stator resistance module 216 receives as input the initial stator resistance data 225 generated by the initial stator resistance module 212 and the temperature coefficient data 230 generated by the temperature coefficient module 214. The stator resistance module 216 determines a stator resistance value based on the initial stator resistance data 225 and the temperature coefficient data 230. In some embodiments, the stator resistance module 216 determines the stator resistance value by multiplying the initial stator resistance value and the temperature coefficient value. The stator resistance module 216 generates stator resistance data 232 indicating the determined stator resistance.

In various embodiments, the motor control module 210 receives as input the stator resistance data 232 generated by the stator resistance module 216. The motor control module 210 may adjust one or more parameters of the operation of the electric motor 21 based on the stator resistance value of the stator resistance data 232. In various embodiments, the motor control module 210 may use one or more of the stator resistance value, the motor position 240, the current 238, the direct current (DC) voltage 236, and a torque command 234 to adjust one or more parameters such as, but not limited to, current control, current reference generation, modulation index calculation, observer, state filter, and online calculation related to motor status at given speeds.

Figure 3:
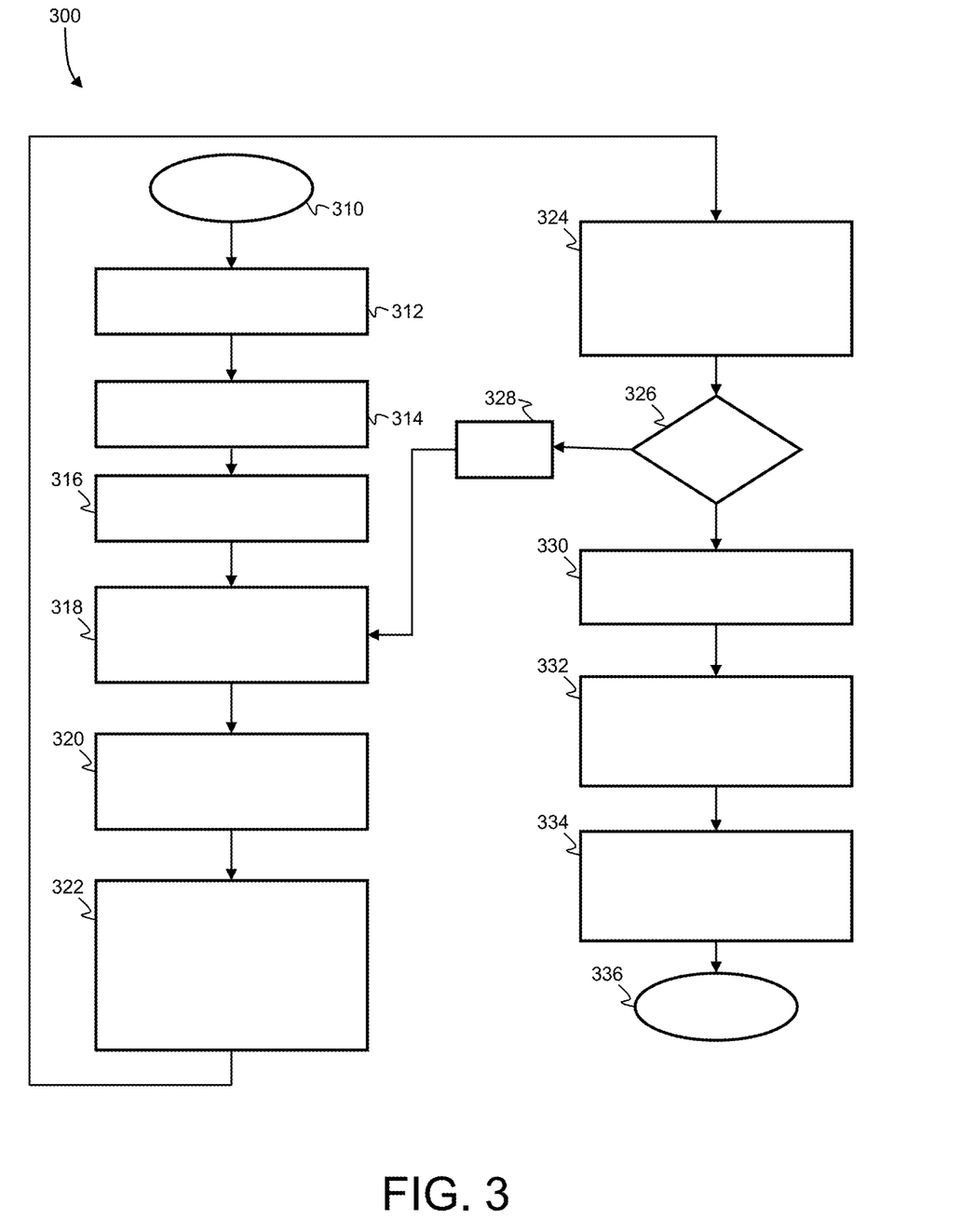
FIG. 3 is a flow chart of a method for determining stator resistance for an electric motor in accordance with an embodiment.

With reference now to FIG. 3 and with continued reference to FIGS. 1-2, a flowchart provides a method 300 for determining a reference temperature and a nonlinear resistance ratio curve which may be uploaded and stored for reference by the motor control system 100 (e.g., by the initial stator resistance module 212 and the temperature coefficient module 214, respectively), in accordance with exemplary embodiments. As can be appreciated in light of the disclosure, the order of operation within the method 300 is not limited to the sequential execution as illustrated in FIG. 3 but may be performed in one or more varying orders as applicable and in accordance with the present disclosure. In various embodiments, certain steps of the method 300 may be executed by one or more processors that are not associated with a vehicle (e.g., of the remote system 36) and certain steps of the method 300 may be executed by one or more processors that are associated with the vehicle 10 (e.g., the processor(s) 44.

In one example, the method 300 may start at 310. As will be clear from the description below, one or more steps of the method 300 may be performed one or more times during the method 300. As such, various steps may be described as being executed at one or more iterations. At 312, the method 300 may include receiving a designed resistance value ($R_D$) of the stator of the electric motor 21. In some embodiments, the designed resistance value ($R_D$) may be provided by the manufacturer of the electric motor 21.

At 314, the method 300 may include determining and storing a reference temperature ($T_x$). During a first iteration of the step 314, the reference temperature ($T_x$) may be a first reference temperature (e.g., 20° C.). During such first iteration, the first reference temperature may be set to a first value at 316, (e.g., $T_{x=1}$). Upon subsequent iterations of the steps 314 and 316, the reference temperature ($T_x$) may be a subsequent reference temperature (e.g., 50° C., 90° C., 150° C., etc.) and may be set to a subsequent value (e.g., $T_{x=2, 3, 4, \ldots n}$).

Figure 4:
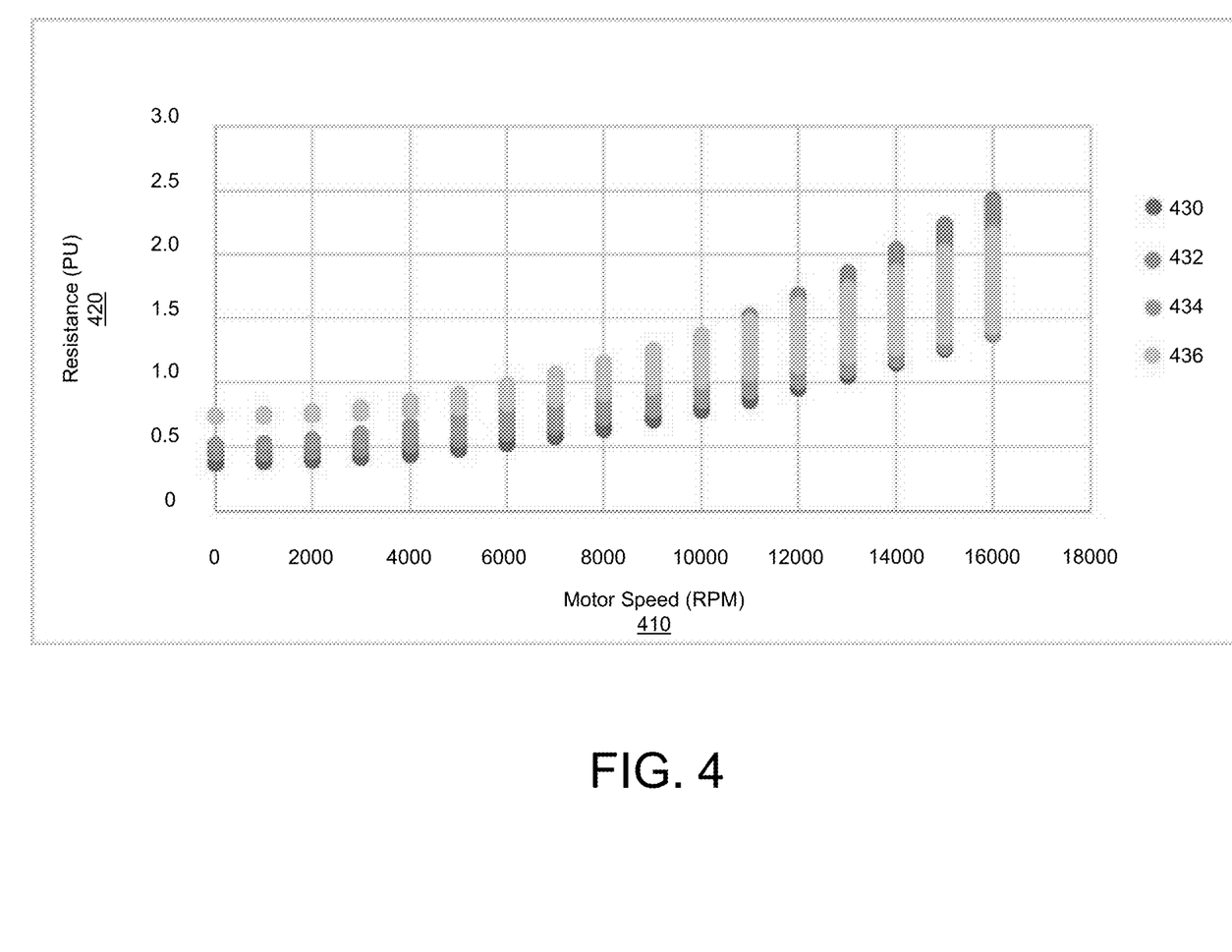
FIG. 4 is a graph presenting resistance values relative to motor speed for an exemplary electric motor at various reference temperatures in accordance with an embodiment.

At 318, the method 300 may include determining, with one or more processors, a resistance value ($R_s$) for the stator at the reference temperature ($T_x$) of the stator as a function of current magnitude ($I_{SS}$), current angle ($I_{beta}$), and motor speed ($S_M$) at the reference temperature ($T_x$). For example, FIG. 4 represents resistance values ($R_s$; y-axis 420) for a stator of an exemplary electric motor relative to motor speed ($M_s$; x-axis 410) at reference temperatures of 20° C. (reference 430), 50° C. (reference 432), 90° C. (reference 434), and 150° C. (reference 436). As presented, the resistance values ($R_s$) increase in a nonlinear manner with increasing motor speed ($M_s$) and vary between the reference temperatures ($T_x$). The resistance values ($R_s$) are presented as per unit (PU) which may relate to various units such as ohms.

Figure 5:
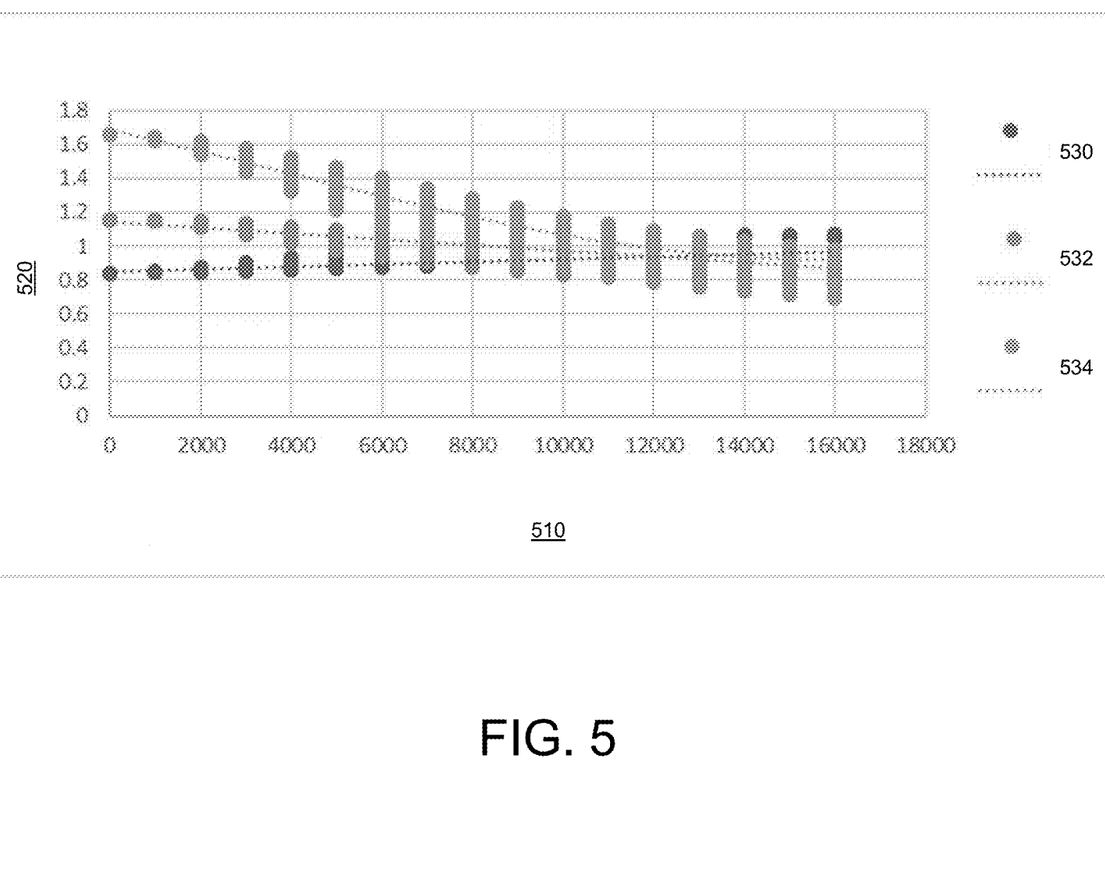
FIG. 5 is a graph presenting resistance ratios relative to motor speed for an exemplary electric motor at a reference temperature in accordance with an embodiment.

At 320, the method 300 may include determining, with the one or more processors, a temperature coefficient ($T_{coeff}$), that is, a nonlinear resistance ratio curve, for the stator for the reference temperature ($T_x$). For example, FIG. 5 presents a plot of resistance ratios (y-axis 520) for the stator of the exemplary electric motor relative to motor speed ($M_s$; X-axis 510) using a reference temperature ($T_x$) of 50° C. The data corresponds to 20° C./50° C. (reference 530), 90° C./50° C. (reference 532), and 150° C./50° C. (reference 534).

At 322, the method 300 may include determining, with the one or more processors, a reconstructed or calculated resistance value ($R_{S\_calc}$) for the stator for the reference temperature ($T_x$) based on the resistance value ($R_s$) and the temperature coefficient value ($T_{coeff}$).

At 324, the method 300 may include determining, with the one or more processors, an error value between the designed resistance value ($R_D$) and the calculated resistance value ($R_{S\_calc}$).

At 326, the method 300 may include updating the reference temperature to a subsequent reference temperature and setting the reference value to a subsequent value at 328. The method 300 may then include repeating steps 318 through 324 for the subsequent reference temperature. This process may be repeated for all reference temperatures (e.g., $T_{x+1}$, $T_{x+2}$, .... $T_{x+n}$).

Once the aforementioned steps 318 through 328 have been completed for all reference temperatures, the method 300 continues at 330 with storing, with the one or more processors, one of the reference temperatures ($T_x$) having a lowest of the error values referred to hereinafter as the final reference temperature ($T_{final}$).

In various embodiments, the final reference temperature ($T_{final}$) may be stored in the data storage device 32 onboard a vehicle (e.g., the vehicle 10) for use in determining stator resistance during operation of an electric vehicle. In various embodiments, the method 300 may include at 332 determining the resistance value ($R_S$) at the final reference temperature ($T_{final}$) and at 334 determining the temperature coefficient ($T_{coeff}$) at the final reference temperature ($T_{final}$). Steps 332 and 334 may be performed during operation of the electric vehicle. In various embodiments, steps 332 and 334 may be performed by one or more processors of the vehicle (e.g., the processor(s) 44).

The systems and methods disclosed herein provide various benefits over certain existing systems and methods. For example, various existing systems and methods may be less accurate in determining the stator resistance of an electric motor during operation thereof relative to the systems and methods herein. The systems and methods promote accuracy of this determination by accounting for the nonlinear relationship of stator resistance at various operating speeds of the electric motor by, in some embodiments, determining a reference temperature having a low error relative to other possible reference temperatures. In contrast, certain existing systems relay on linear algorithms for calculating and/or estimating resistance with compensation for temperature such as the below equation 1.

$$R_s(T) = R_s(25° \text{ C.}) \times R_s(AC) \times (1 + \alpha \times (T - 25° \text{ C.})), \quad \text{eq. (1)}$$

where $R_s(T)$ is the stator DC-resistance at T, $R_s(25° \text{ C.})$ is the stator resistance at 25° C., AC is the alternating current (AC) coefficient, α is the temperature coefficient which is material dependent, and T is the temperature. Linear methods such as this may result in significant error (e.g., greater than 10%), especially with increasing motor speed.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method, comprising:
    receiving, with the one or more processors, designed resistance values of a stator of an electric motor;
    determining, with one or more processors, at least two resistance values for the stator for at least two different reference temperatures of the stator;
    determining, with the one or more processors, temperature coefficient values for the stator for each the at least two different reference temperatures;
    determining, with the one or more processors, calculated resistance values for the stator for each of the at least two different reference temperatures based on the at least two resistance values and the temperature coefficient values;
    determining, with the one or more processors, error values between the designed resistance values and the calculated resistance values at each of the at least two different reference temperatures;
    determining, with the one or more processors, which one of the at least two different reference temperatures has a lowest of the error values;
    setting the one of the at least two different reference temperatures with the lowest of the error values as a stator reference temperature;
    determining, by one or more processors, an initial stator resistance value of the electric motor based on the stator reference temperature and either estimated data or sensor data indicative of sensed conditions of the electric motor including a current magnitude, a current angle, a motor speed, a temperature of a stator of the electric motor, and a temperature of a rotor of the electric motor;
    determining, by the one or more processors, a stator temperature coefficient based on the sensor data and a stator nonlinear resistance ratio curve; and
    determining, by the one or more processors, a stator resistance value based on the initial stator resistance value and the stator temperature coefficient.

2. The method of claim 1, wherein the temperature coefficient values are defined by nonlinear resistance ratio curves.

3. The method of claim 1, wherein the initial stator resistance value is determined based on the sensor data and the stator reference temperature.

4. The method of claim 1, wherein the stator nonlinear resistance ratio curve is based on the stator reference temperature.

5. The method of claim 1, wherein the electric motor is a component of a propulsion system for a vehicle, wherein the stator resistance value is determined during operation of the propulsion system.

6. The method of claim 1, wherein the electric motor is a 3-phase alternating current motor.

7. The method of claim 1, further comprising adjusting an operating parameter of the electric motor based on the stator resistance value.

8. A system, comprising:
    an electric motor comprising a stator and a rotor;
    a sensor system including one or more sensors configured to generate sensor data indicative of sensed operating conditions of the electric motor including a current magnitude, a current angle, a motor speed, a temperature of the stator, and a temperature of the rotor; and a controller operably coupled with the sensor system and the electric motor, the controller configured to, by one or more processors:

receive designed resistance values of the stator of the electric motor;

determine at least two resistance values for the stator for at least two different reference temperatures of the stator;

determine temperature coefficient values for the stator for each the at least two different reference temperatures;

determine calculated resistance values for the stator for each of the at least two different reference temperatures based on the at least two resistance values and the temperature coefficient values;

determine error values between the designed resistance values and the calculated resistance values at each of the at least two different reference temperatures;

determine which one of the at least two different reference temperatures has a lowest of the error values;

set the one of the at least two different reference temperatures with the lowest of the error values as a stator reference temperature;

determine an initial stator resistance value based on the stator reference temperature and either estimated data of sensor data or sensor data received from the sensor system;

determine a stator temperature coefficient based on the sensor data and a stator nonlinear resistance ratio curve; and determine a stator resistance value based on the initial stator resistance value and the stator temperature coefficient.

9. The system of claim 8, wherein the calculated resistance values are based on a plurality of resistance values at each of the plurality of reference temperatures and temperature coefficient values at each of the plurality of reference temperatures, wherein the temperature coefficient values are defined by nonlinear resistance ratio curves.

10. The system of claim 8, wherein the initial stator resistance value is determined based on the sensor data and the stator reference temperature.

11. The system of claim 8, wherein the stator nonlinear resistance ratio curve is based on the stator reference temperature.

12. The system of claim 8, wherein the electric motor is a component of a propulsion system for a vehicle, wherein the stator resistance value is determined during operation of the propulsion system.

13. The system of claim 8, wherein the electric motor is a 3-phase alternating current motor.

14. The system of claim 8, wherein the controller is configured to, by the one or more processors, adjust an operating parameter of the electric motor based on the stator resistance value.

15. A vehicle, comprising:

an electric motor comprising a stator and a rotor;

a sensor system including one or more sensors configured to generate sensor data indicative of sensed operating conditions of the electric motor including a current magnitude, a current angle, a motor speed, a temperature of the stator, and a temperature of the rotor; and a controller operably coupled with the sensor system and the electric motor, the controller configured to, by one or more processors:

receive designed resistance values of the stator of the electric motor;

determine at least two resistance values for the stator for at least two different reference temperatures of the stator;

determine temperature coefficient values for the stator for each the at least two different reference temperatures;

determine calculated resistance values for the stator for each of the at least two different reference temperatures based on the at least two resistance values and the temperature coefficient values;

determine error values between the designed resistance values and the calculated resistance values at each of the at least two different reference temperatures;

determine which one of the at least two different reference temperatures has a lowest of the error values;

set the one of the at least two different reference temperatures with the lowest of the error values as a stator reference temperature;

determine an initial stator resistance value based on the stator reference temperature and either estimated data or sensor data received from the sensor system;

determine a stator temperature coefficient based on the sensor data and a stator nonlinear resistance ratio curve;

determine a stator resistance value based on the initial stator resistance value and the stator temperature coefficient; and adjust an operating parameter of the electric motor based on the stator resistance value.

16. The vehicle of claim 15, wherein the initial stator resistance value is determined based on the sensor data and the stator reference temperature.

17. The vehicle of claim 15, wherein the stator nonlinear resistance ratio curve is based on the stator reference temperature.

18. The vehicle of claim 15, wherein the electric motor is a component of a propulsion system of the vehicle, wherein the stator resistance value is determined during operation of the propulsion system.

* * * * *